United States Patent
Yang

(10) Patent No.: US 10,964,261 B2
(45) Date of Patent: Mar. 30, 2021

(54) PIXEL CIRCUITRY, DRIVING METHOD THEREOF AND DISPLAY DEVICE

(71) Applicant: BOE TECHNOLOGY GROUP CO., LTD., Beijing (CN)

(72) Inventor: Cheng Chung Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 174 days.

(21) Appl. No.: 16/337,227

(22) PCT Filed: Aug. 1, 2018

(86) PCT No.: PCT/CN2018/097983
§ 371 (c)(1),
(2) Date: Mar. 27, 2019

(87) PCT Pub. No.: WO2019/029410
PCT Pub. Date: Feb. 14, 2019

(65) Prior Publication Data
US 2019/0304368 A1 Oct. 3, 2019
US 2020/0312243 A9 Oct. 1, 2020

(30) Foreign Application Priority Data

Aug. 10, 2017 (CN) .......................... 201710683068.8

(51) Int. Cl.
*G09G 3/3233* (2016.01)
*H01L 27/32* (2006.01)

(52) U.S. Cl.
CPC ....... *G09G 3/3233* (2013.01); *H01L 27/3244* (2013.01); *G09G 2320/0233* (2013.01)

(58) Field of Classification Search
None
See application file for complete search history.

(56) References Cited

U.S. PATENT DOCUMENTS

2015/0379934 A1* 12/2015 Xiaoling .............. G09G 3/3233
345/214
2016/0189627 A1* 6/2016 Park ..................... G09G 3/3233
345/78

FOREIGN PATENT DOCUMENTS

CN 103680406 A 3/2014
CN 104715726 A 6/2015
(Continued)

OTHER PUBLICATIONS

PCT International Search Report, Application No. PCT/CN2018/097983, dated Sep. 30, 2018, 5 pages: with English translation.
(Continued)

*Primary Examiner* — Aneeta Yodichkas
(74) *Attorney, Agent, or Firm* — Armstrong Teasdale LLP

(57) ABSTRACT

Embodiments of the present disclosure provide a pixel circuitry, a method for driving the pixel circuitry, an array substrate, and a display device. The pixel circuitry may include a preset circuit, a storage circuit, a driving circuit, a compensation circuit, and a light emitting element. The preset circuit may provide a signal from a data signal terminal to a first node, and provide a signal from an initialization signal terminal to a second node. The storage circuit may store a voltage difference between the first node and the second node. The driving circuit may provide a driving current to a third node according to a voltage of the first node. The compensation circuit may compensate for a voltage of the second node according to a signal from a control signal terminal. The light emitting element may emit light according to the driving current.

20 Claims, 8 Drawing Sheets

(56) References Cited

FOREIGN PATENT DOCUMENTS

| | | |
|---|---|---|
| CN | 104778925 A | 7/2015 |
| CN | 105405399 A | 3/2016 |
| CN | 105489163 A | 4/2016 |
| CN | 206021875 U | 3/2017 |
| CN | 106782325 A | 5/2017 |
| CN | 107393475 A | 11/2017 |
| TW | 201218165 A | 5/2012 |

OTHER PUBLICATIONS

PCT Written Opinion, Application No. PCT/CN2018/097983, dated Sep. 30, 2018, 6 pages.: with English translation of relevant part.
China First Office Action, Application No. 201710683068.8, dated Dec. 25, 2018, 21 pps.: with English translation.
China Second Office Action, Application No. 201710683068.8, dated Jun. 28, 2019, 21 pps.: with English translation.

\* cited by examiner

PIXEL CIRCUITRY, DRIVING METHOD THEREOF AND DISPLAY DEVICE

CROSS REFERENCE TO RELATED APPLICATIONS

This application is a National Stage Entry of PCT/CN2018/097983 filed on Aug. 1, 2018, which claims the benefit and priority of Chinese Patent Application No. 201710683068.8 filed on Aug. 10, 2017, the disclosures of which are incorporated by reference herein in their entirety as part of the present application.

BACKGROUND

Embodiments of the present disclosure relates to the field of display technologies, and in particular, to a pixel circuitry, a method for driving the pixel circuitry, an array substrate, and a display device.

Organic Light Emitting Diode (OLED) is one of the hotspots in the field of display research. Compared with liquid crystal display (LCD), OLED has advantages of low energy consumption, low production cost, self-illumination, a wide viewing angle, and a high response speed.

BRIEF DESCRIPTION

Embodiments of the present disclosure provide a pixel circuitry, a method for driving the pixel circuitry, an array substrate, and a display device.

A first aspect of the present disclosure provides a pixel circuitry. The pixel circuitry may include a preset circuit, a storage circuit, a driving circuit, a compensation circuit, and a light emitting element. The preset circuit is coupled to a first driving signal terminal, a data signal terminal, a first node, a second driving signal terminal, an initialization signal terminal, and a second node, respectively, and is configured to provide a signal from the data signal terminal to the first node under the control of a signal from the first driving signal terminal, and to provide a signal from the initialization signal terminal to the second node under the control of a signal from the second driving signal terminal. The storage circuit is coupled between the first node and the second node and is configured to store a voltage difference between the first node and the second node. The driving circuit is coupled to the first node, a third node, and a first voltage signal terminal, respectively, and is configured to provide a driving current to the third node under the control of a voltage of the first node. The compensation circuit is coupled to the second node, the third node, and a control signal terminal, respectively, and is configured to compensate for a voltage of the second node under the control of a signal from the control signal terminal. The light emitting element is coupled between the second node and a second voltage signal terminal and is configured to emit light according to the driving current.

In an embodiment of the present disclosure, the preset circuit includes a first transistor and a second transistor. A control electrode of the first transistor is coupled to the first driving signal terminal, a first electrode of the first transistor is coupled to the data signal terminal, and a second electrode of the first transistor is coupled to the first node. A control electrode of the second transistor is coupled to the second driving signal terminal, a first electrode of the second transistor is coupled to the initialization signal terminal, and a second electrode of the second transistor is coupled to the second node.

In an embodiment of the present disclosure, the storage circuit includes a first capacitor. One end of the first capacitor is coupled to the first node, and the other end of the first capacitor is coupled to the second node.

In an embodiment of the present disclosure, the driving circuit includes a driving transistor. A control electrode of the driving transistor is coupled to the first node, a first electrode of the driving transistor is coupled to the third node, and a second electrode of the driving transistor is coupled to the first voltage signal terminal.

In an embodiment of the present disclosure, the compensation circuit is further configured to control, under the control of a signal from the control signal terminal, a current in the driving transistor to flow from the third node to the second node to increase the voltage of the second node until the voltage of the second node is increased up to a voltage difference between a voltage of the first node and a threshold voltage of the driving transistor.

In an embodiment of the present disclosure, the compensation circuit includes a third transistor. A control electrode of the third transistor is coupled to the control signal terminal, a first electrode of the third transistor is coupled to the second node, and a second electrode of the third transistor is coupled to the third node.

In an embodiment of the present disclosure, the light emitting element is one of a light emitting diode, an organic light emitting diode, and an active matrix organic light emitting diode.

A second aspect of the present disclosure provides a pixel circuitry. The pixel circuitry includes a first transistor, a second transistor, a first capacitor, a driving transistor, a third transistor, and a light emitting element. A control electrode of the first transistor is coupled to a first driving signal terminal, a first electrode of the first transistor is coupled to a data signal terminal, and a second electrode of the first transistor is coupled to the first node. A control electrode of the second transistor is coupled to a second driving signal terminal, a first electrode of the second transistor is coupled to an initialization signal terminal, and a second electrode of the second transistor is coupled to a second node. One end of the first capacitor is coupled to the first node, and the other end of the first capacitor is coupled to the second node. A control electrode of the driving transistor is coupled to the first node, a first electrode of the driving transistor is coupled to a third node, and a second electrode of the driving transistor is coupled to a first voltage signal terminal. A control electrode of the third transistor is coupled to a control signal terminal, a first electrode of the third transistor is coupled to the second node, and a second electrode of the third transistor is coupled to the third node. The light emitting element is coupled between the second node and a second voltage signal terminal.

In an embodiment of the present disclosure, the first transistor, the second transistor, the third transistor, and the driving transistor are N-type transistors.

A third aspect of the present disclosure provides a method for driving a pixel circuitry of the first or second aspect of the present disclosure. In the method, in a first period of time, a signal from a data signal terminal is provided to a first node under the control of a signal from the first driving signal terminal, and a signal from an initialization signal terminal is provided to a second node under the control of a signal from a second driving signal terminal. In a second period of time, a voltage of the second node is compensated for under the control of a signal from a control signal terminal. In a third period of time, a voltage of the signal from the data signal terminal changes, and under the control of a signal from the first driving signal terminal, the signal from the data signal terminal is provided to the first node, and a voltage of the second node is controlled via a storage circuit. In a fourth period of time, under the control of the voltage of the first node, a driving current is provided to the third node, such that a light emitting element emits light according to the driving current.

In an embodiment of the present disclosure, in the first period of time, the signal from the first driving signal terminal is at a high level, the voltage of the signal from the data signal terminal is a reference voltage, the signal from the second driving signal terminal is a high level signal, and the signal from the initialization signal terminal is an initialization voltage. A voltage value of the initialization voltage is less than a voltage value of a voltage from a second voltage signal terminal.

In an embodiment of the present disclosure, in the second period of time, the signal from the first driving signal terminal is at a high level, the voltage of the signal from the data signal terminal is the reference voltage, the signal from the control signal terminal is at a high level, and the current of a driving transistor in the driving circuit flows from the third node to the second node to increase the voltage of the second node to a voltage difference between the voltage of the first node and a threshold voltage of the driving transistor, the voltage difference being less than the voltage from the second voltage signal terminal.

In an embodiment of the present disclosure, in the third period of time, the signal from the first driving signal terminal is at a high level, and the voltage of the signal from the data signal terminal is a data voltage, wherein the voltage value of the data voltage is less than the voltage value of the reference voltage.

In an embodiment of the present disclosure, in the fourth period of time, the signal from the control signal terminal is at a high level, and the driving current is in correlation with the data voltage and the reference voltage.

A fourth aspect of the present disclosure provides an array substrate. The array substrate includes the pixel circuitry of the first or second aspect of the present disclosure.

A fifth aspect of the present disclosure provides a display device. The display device includes the array substrate of the fourth aspect of the present disclosure.

BRIEF DESCRIPTION OF THE DRAWINGS

In order to illustrate the technical solution of the present disclosure more clearly, the drawings of the embodiments will be briefly described below. It should be noted that the drawings described below are only some embodiments of the present disclosure, not limitations to the present disclosure, wherein the same reference numerals indicate the same elements or signals. In the drawings:

FIGS. 5A-5D are schematic diagrams showing a process of a pixel circuitry in operation according to an embodiment of the present disclosure, wherein FIG. 5A shows a first stage, FIG. 5B shows a second stage, FIG. 5C shows a third stage, and FIG. 5D shows a fourth stage.

DETAILED DESCRIPTION

In order to make the above technical solutions and advantages of the present disclosure more obvious and understandable, the embodiments of the present disclosure will be described in detail below with reference to the accompanying drawings. It should be noted that, the embodiments in the present application and the features in the embodiments may be combined with each other if there is no conflict.

In the description of the present disclosure, "a plurality" means two or more, unless otherwise stated. The terms "upper", "lower", "left", "right", "inside", "outside" and the like indicate orientations or positional relationships based on the drawings, and are merely intended to describe embodiments of the present disclosure and simplify the description, without suggesting or implying that a machine or component referred to must have a specific orientation, or is constructed and operated in a specific orientation, and are therefore not to be construed as limiting the disclosure.

In the description of the present disclosure, it should be noted that the terms "mounted", "connected", and "coupled" are to be understood broadly, unless specifically stated and defined otherwise. For example, they may refer to a fixed connection, a removable connection, or an integrated connection. They may refer to a mechanical connection or an electrical connection. They may refer to a direct connection or an indirect connection via an intermediate medium. The specific meanings of the above terms in the present disclosure may be understood in specific circumstances by those of ordinary skill in the art.

Those skilled in the art may understand that the transistors used in the embodiments of the present disclosure may be thin film transistors or field effect transistors or other devices having similar characteristics. In an embodiment of the present disclosure, the thin film transistor may be an oxide semiconductor transistor. A gate of a transistor may also be referred to as a control electrode. As a source and a drain of a transistor are symmetrical, the source and drain may be interchanged. In the embodiments of the present disclosure, in order to distinguish the two electrodes of a transistor other than the control electrode, one of them is referred to as a first electrode, and the other electrode is referred to as a second electrode. Therefore, the first electrode may be the source or the drain, and the second electrode may be the drain or the source.

Figure 1:
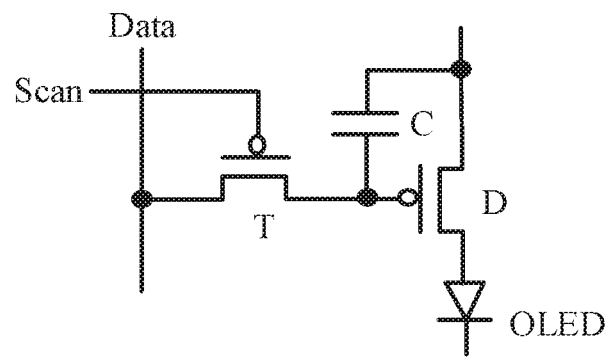
FIG. 1 illustrates a circuit diagram of an exemplary pixel circuitry.

A pixel circuitry is a core technology of a display. In a display, a stable current is required to control illumination of a light emitting element. FIG. 1 is an exemplary circuit diagram of a pixel circuitry. As shown in FIG. 1, the pixel circuitry has a 2T1C structure, that is, two transistors (a driving transistor D and a transistor T) and one capacitor C. The driving transistor D and the transistor T are both P-type transistors. When a scan line Scan selects (i.e., scans) a certain line, the scan line Scan provides a low level signal, such that the transistor T is turned on. In this way, a data signal Vdata on a data line Data is transferred to a gate of the driving transistor D and stored by the storage capacitor C. When the scanning of this line is completed, the signal provided by the scan line Scan becomes a high level, such that the transistor T is turned off. The driving transistor D generates a current according to a voltage of gate of the driving transistor D, thereby driving the light emitting element OLED. Thus, it is ensured that the light emitting element OLED continues to emit light in one frame of display.

In an embodiment where the driving transistor D is an N-type transistor, source of the driving transistor D is coupled to an anode of the OLED. When the driving transistor D attains a saturation state, the driving current may be calculated as $I=K(VGS-Vth)^2=K(VG-VS-Vth)^2$, where K is a constant related to process parameters and geometric dimensions of the driving transistor D, VG is a gate voltage of the driving transistor D, VS is a source voltage of the driving transistor D, and Vth is a threshold voltage of the driving transistor D.

The threshold voltage Vth of the driving transistor D may drift due to processes and device aging. In addition, since the source of the driving transistor D is coupled to the anode of the light emitting element OLED, in a light emitting stage, the source voltage VS of the driving transistor D changes as the anode voltage of the light emitting element OLED changes, such that the driving current flowing through each OLED changes due to changes in Vth and VS. Therefore, the light emitting luminance of different light emitting elements OLEDs may be inconsistent, such that the display luminance of a display may be uneven, which may affect display effect of an entire display.

Figure 2:
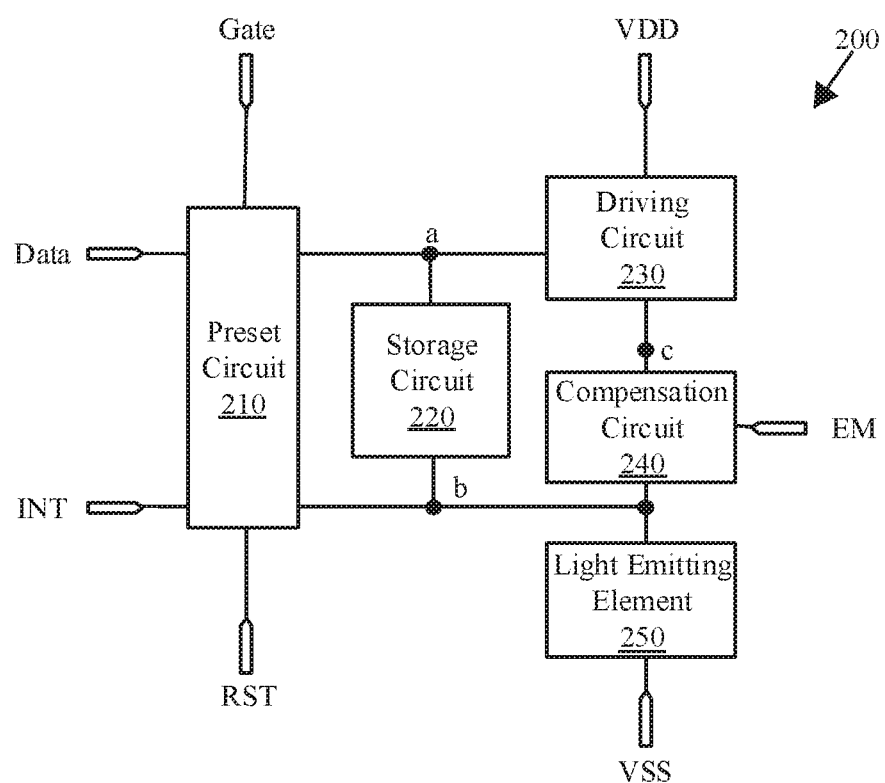
FIG. 2 illustrates a schematic block diagram of a pixel circuitry according to an embodiment of the present disclosure.

FIG. 2 shows a schematic block diagram of a pixel circuitry according to an embodiment of the present disclosure. As shown in FIG. 2, the pixel circuitry 200 may include a preset circuit 210, a storage circuit 220, a driving circuit 230, a compensation circuit 240, and a light emitting element 250. Signal terminals of the pixel circuitry 200 may include a first driving signal terminal Gate, a data signal terminal Data, a second driving signal terminal RST, an initialization signal terminal INT, a first voltage signal terminal VDD, and a second voltage signal terminal VSS.

In an embodiment, the preset circuit 210 may be coupled to the first driving signal terminal Gate, the data signal terminal Data, a first node a, the second driving signal terminal RST, the initialization signal terminal INT, and a second node b, respectively. The preset circuit 210 may provide a signal from the data signal terminal Data to the first node a under the control of a signal from the first driving signal terminal Gate, and may provide a signal from the initialization signal terminal INT to the second node b under the control of a signal from the second driving signal terminal RST.

The storage circuit 220 may be coupled between the first node a and the second node b. The storage circuit 220 may store a voltage difference between the first node a and the second node b.

The driving circuit 230 may be coupled to the first node a, a third node c, and the first voltage signal terminal VDD, respectively. The driving circuit 230 may provide a driving current to the third node c under the control of a voltage of the first node a.

The compensation circuit 240 may be coupled to the second node b, the third node c, and a control signal terminal EM, respectively, that is, may be coupled to the driving circuit 230 and the light emitting element 250. The compensation circuit 240 may couple the second node b to the third node c to compensate for the voltage of the second node b, under the control of a signal from the control signal terminal EM. Specifically, under the control of the signal from the control signal terminal EM, the current in the driving circuit 230 flows from the third node c to the second node b via the compensation circuit 240, to increase the voltage of the second node b.

The light emitting element 250 may be coupled between the second node b and the second voltage signal terminal VSS. The light emitting element 250 may emit light according to the driving current. Specifically, under the control of the signal from the control signal terminal EM, the driving current provided by the driving circuit 230 flows to the light emitting element 250 via the compensation circuit 240, such that the light emitting element 250 emits light according to the driving current. In this embodiment, the anode of the light emitting element 250 is coupled to the second node b, and the cathode of the light emitting element 250 is coupled to the second voltage signal terminal VSS.

In an embodiment of the present disclosure, the first driving signal terminal Gate may be coupled to the scan line, such that the signal from the first driving signal terminal Gate may be a gate driving signal. The data signal terminal Data may be coupled to the data line, such that the signal from the data signal terminal Data may be a data signal. The voltage of the data signal may be, for example, a reference voltage Vref, or a data voltage Vdata for controlling the light emission of the light emitting element. In an embodiment, the data voltage Vdata is less than the reference voltage Vref, i.e., Vdata<Vref.

In an embodiment of the present disclosure, the initialization signal terminal INT may provide a low level signal, for example below 0V, such as 0V, -3V, -5V, and the like. The voltage Vdd of the first voltage signal terminal VDD may be set to a high level, for example, 5V or more. The voltage Vss of the second voltage signal terminal VSS may be set to a low level. In an embodiment, the voltage Vss of the second voltage signal terminal VSS is less than the voltage Vdd of the first voltage signal terminal VDD, and is greater than the voltage Vint of an input signal from the initialization signal terminal INT, that is, Vdd>Vss>Vint.

Figure 3:
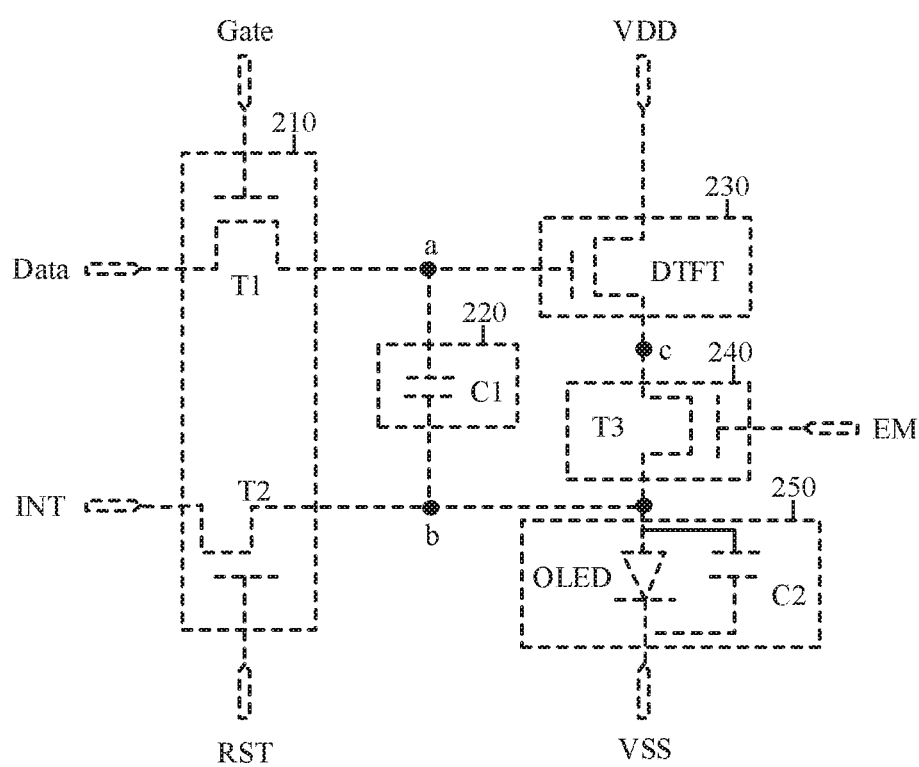
FIG. 3 illustrates an exemplary circuit diagram of a pixel circuitry according to an embodiment of the present disclosure.

FIG. 3 illustrates an exemplary circuit diagram of a pixel circuitry according to an embodiment of the present disclosure. The pixel circuitry is, for example, the pixel circuitry 200 shown in FIG. 2. Exemplary structures of the preset circuit 210, the storage circuit 220, the driving circuit 230, the compensation circuit 240, and the light emitting element 250 are specifically illustrated in FIG. 3. Those skilled in the art may readily appreciate that implementation of the above circuits is not limited thereto, and other circuit structures may be used as long as their respective functions may be realized.

As shown in FIG. 3, in the pixel circuitry according to the embodiment of the present disclosure, the preset circuit 210 may include a first transistor T1 and a second transistor T2. A control electrode of the first transistor T1 is coupled to the first driving signal terminal Gate, a first electrode of the first transistor T1 is coupled to the data signal terminal Data, and a second electrode of the first transistor T1 is coupled to the first node a. A control electrode of the second transistor T2 is coupled to the second driving signal terminal RST, a first electrode of the second transistor T2 is coupled to the initialization signal terminal INT, and a second electrode of the second transistor T2 is coupled to the second node b.

The storage circuit 220 may include a first capacitor C1. One end of the first capacitor C1 is coupled to the first node a, and the other end of the first capacitor C1 is coupled to the second node b.

The driving circuit 230 may include a driving transistor DTFT. A control electrode of the driving transistor DTFT is coupled to the first node a, a first electrode of the driving transistor DTFT is coupled to the third node c, and a second electrode of the driving transistor DTFT is coupled to the first voltage signal terminal VDD. In an embodiment of the present disclosure, the control electrode of the driving transistor DTFT is a gate, the first electrode of the driving transistor DTFT is a source, and the second electrode of the driving transistor DTFT is a drain.

The compensation circuit 240 may include a third transistor T3. A control electrode of the third transistor T3 is coupled to the control signal terminal EM, a first electrode of the third transistor T3 is coupled to the second node b, and a second electrode of the third transistor T3 is coupled to the third node c.

The light emitting element 250 may include one of a light emitting diode LED, an organic light emitting diode OLED, and an active matrix organic light emitting diode AMOLED. FIG. 3 exemplarily shows an organic light emitting diode OLED as the light emitting element 250. The anode of the organic light emitting diode OLED is coupled to the second node b, and the cathode of the organic light emitting diode OLED is coupled to the second voltage signal terminal VSS. Further, the light emitting element 250 also has a parasitic capacitor. FIG. 3 schematically shows a parasitic capacitor C2 of the organic light emitting diode OLED. It may be understood that the parasitic capacitor is connected in parallel at the two ends of the organic light emitting diode OLED. One end of the parasitic capacitor C2 is coupled to the second node b, and the other end of the parasitic capacitor C2 is coupled to the second voltage signal terminal VSS. The parasitic capacitor C2 may store a voltage difference between the second node b and the second voltage signal terminal VSS.

In the embodiment of the present disclosure, the driving transistor DTFT, the first transistor T1, the second transistor T2, and the third transistor T3 are all N-type transistors, such as N-type thin film transistors. Therefore, process flow may be unified, manufacturing processes of the display may be simplified, and yield of the product may be improved.

In an embodiment of the present disclosure, the compensation circuit 240 may control, under the control of a signal from the control signal terminal EM, the driving current provided by the driving transistor DTFT to flow from the third node c to the second node b, to increase the voltage of the second node b. The voltage of the second node b may be increased up to a voltage difference between the voltage of the first node a and the threshold voltage Vth of the driving transistor DTFT.

The operation of the pixel circuitry shown in FIG. 3 may be described in detail below with reference to FIGS. 4 and 5A-5D. As shown in FIG. 3, the pixel circuitry has a 4T1C structure including four transistors (transistors T1 to T3 and a driving transistor DTFT), one capacitor (C1), and seven signal terminals (Data, Gate, INT, VDD, VSS, EM, and RST).

Figure 4:
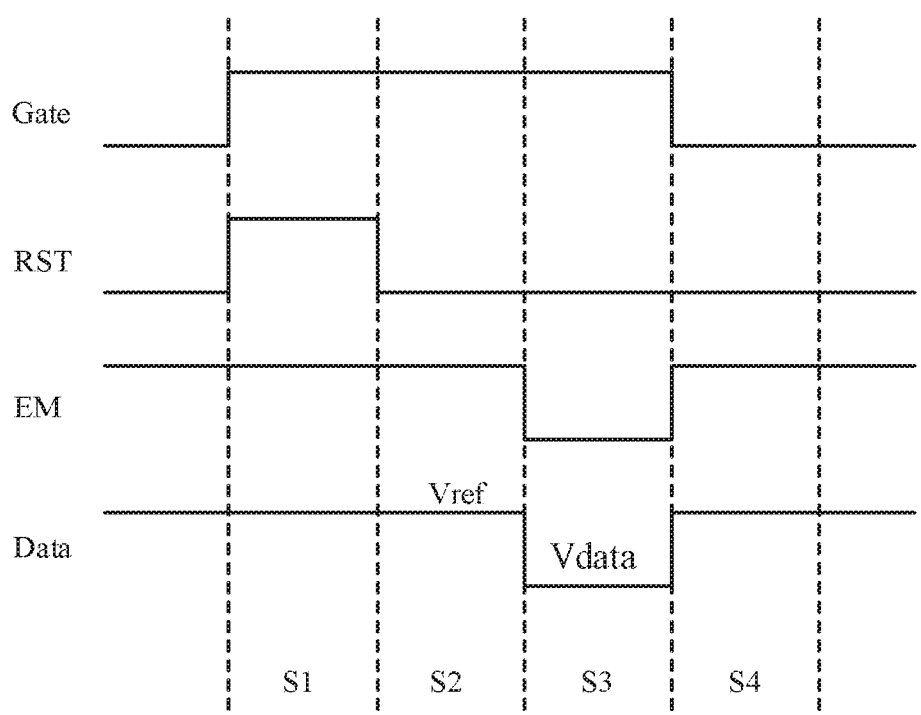
FIG. 4 illustrates a schematic timing diagram of signals in a pixel circuitry according to an embodiment of the present disclosure.

FIG. 4 illustrates a timing diagram of signals in a pixel circuitry according to an embodiment of the present disclosure. As shown in FIG. 4, in a first stage S1, the signal from the control signal terminal EM, the signal from the first driving signal terminal Gate and the signal from the second driving signal terminal RST are at high levels, and the voltage of the signal from the data signal terminal Data is the reference voltage Vref. In a second stage S2, the signal from the control signal terminal EM and the signal from the first driving signal terminal Gate are both at high levels, the signal from the second driving signal terminal RST is at a low level, and the voltage of the signal from the data signal terminal Data is the reference voltage Vref. In a third stage S3, the signal from the first driving signal terminal Gate is at a high level, the signal from the control signal terminal EM and the signal from the second driving signal terminal RST are both at low levels, and the voltage of the signal from the data signal terminal Data is the data voltage Vdata, wherein the voltage value of the data voltage Vdata is less than the voltage value the reference voltage Vref. In a fourth stage S4, the signal from the control signal terminal EM is at a high level, and the signal from the first driving signal terminal Gate and the signal from the second driving signal terminal RST are both at low levels.

Figure 5A:
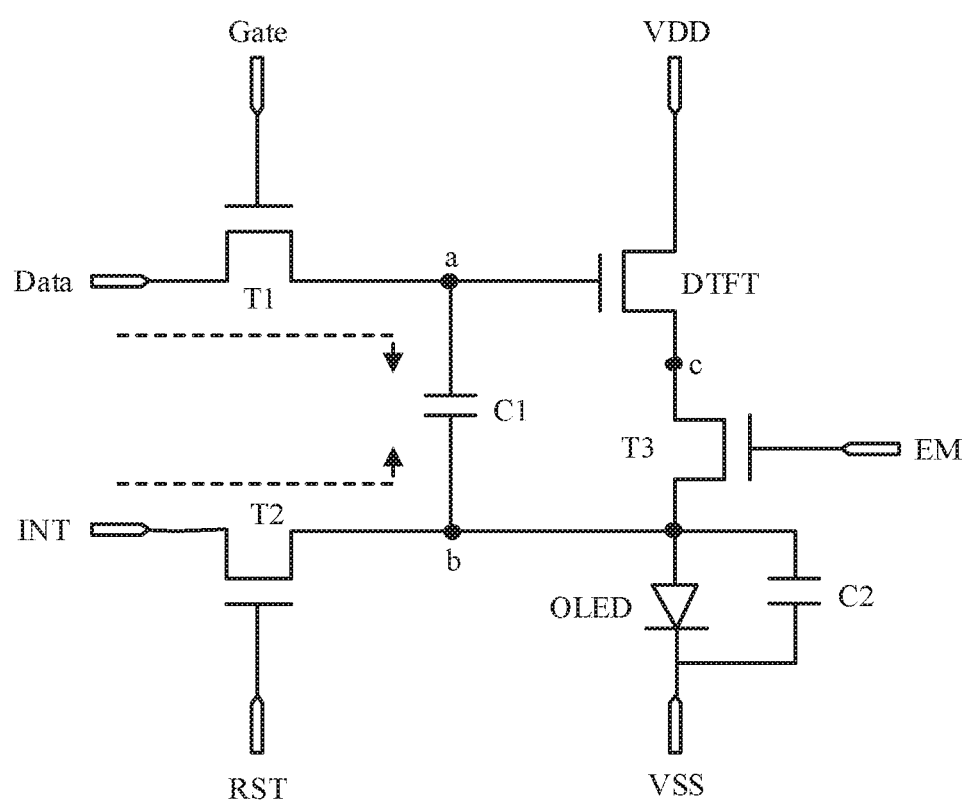
Figure 5B:
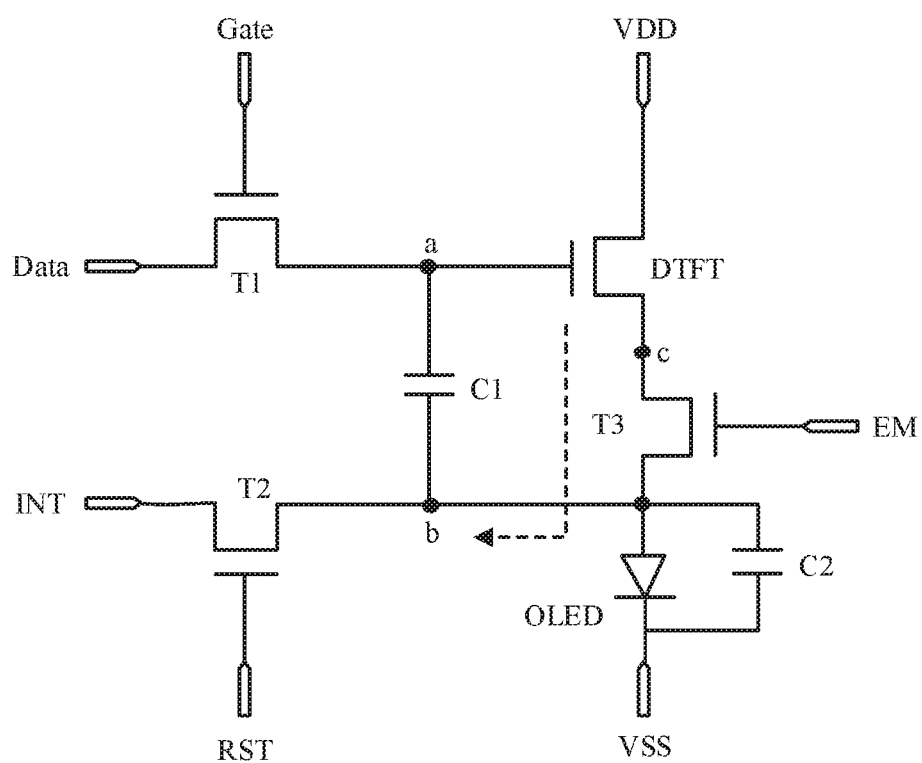
Figure 5C:
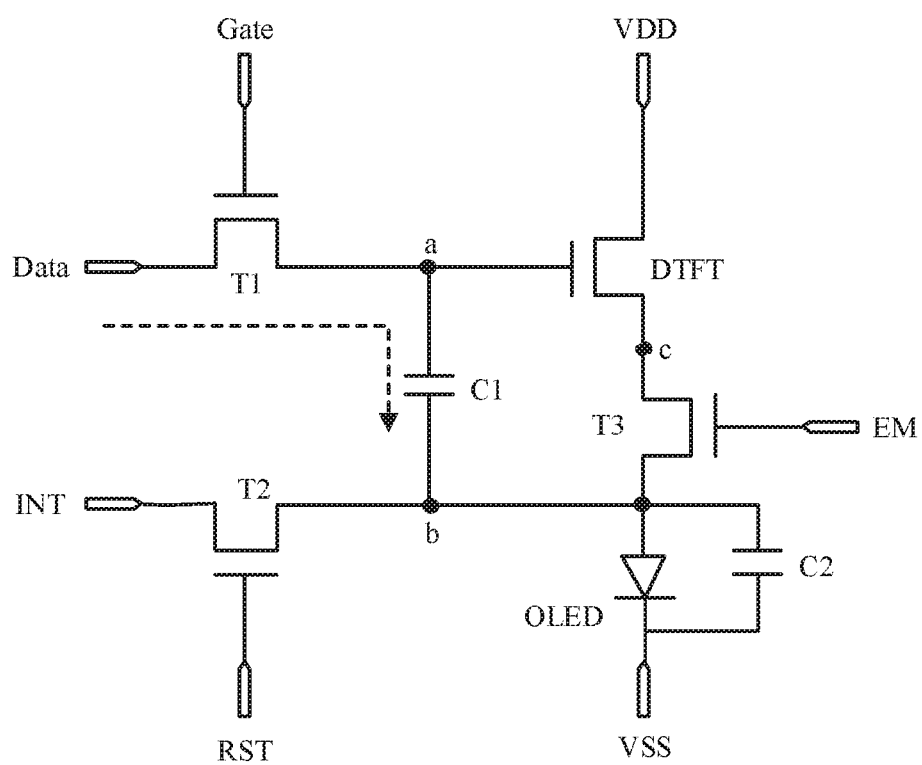
Figure 5D:
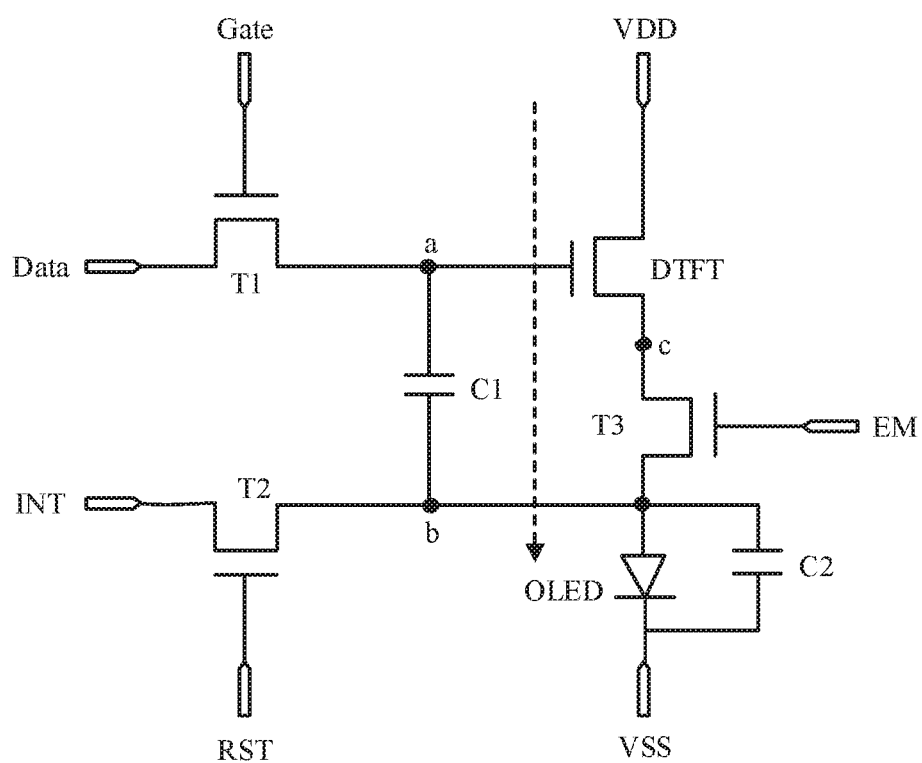

FIG. 5A shows a schematic diagram of a process of a pixel circuitry operating in the first stage according to an embodiment of the present disclosure. FIG. 5B shows a schematic diagram of a process of a pixel circuitry operating in the second stage according to an embodiment of the present disclosure. FIG. 5C shows a schematic diagram of a process of a pixel circuitry operating in the third stage according to an embodiment of the present disclosure. FIG. 5D shows a schematic diagram of a process of a pixel circuitry operating in the fourth stage according to an embodiment of the present disclosure. The operation of the pixel circuitry may be described in detail below.

In the first stage S1 (preset stage), the signal from the control signal terminal EM, the signal from the first driving signal terminal Gate and the signal from the second driving signal terminal RST are all high level signals. The voltage of the signal from the initialization signal terminal INT is the initialization voltage Vint. The voltage of the signal from the data signal terminal Data is the reference voltage Vref. In an embodiment, the voltage value of the initialization voltage Vint is less than the voltage value of the voltage Vss of the second signal terminal VSS, that is, Vint<Vss.

As shown in FIG. 5A, the first transistor T1 is turned on under the control of the signal from the first driving signal terminal Gate. The first transistor T1 may provide the signal from the data signal terminal Data to the first node a, such that the voltage Va of the first node a is the reference voltage Vref. The second transistor T2 is turned on under the control of the signal from the second driving signal terminal RST. The second transistor T2 may provide the signal from the initialization signal terminal INT to the second node b, such that the voltage Vb of the second node b is the initialization voltage Vint. The initialization voltage Vint is at a low level to initialize the voltage Vb of the second node. Therefore, the driving transistor DTFT is turned on. As the first capacitor C1 may store the voltage difference between the first node a and the second node b, the driving transistor DTFT is turned on at the beginning of the next stage, to prepare for threshold compensation. Further, the third transistor T3 is turned on under the control of the high level signal from the control signal terminal EM. Since Vint<Vss, the light emitting diode OLED is in a reverse bias state and therefore does not emit light.

In the second stage S2 (compensation stage), the signal from the control signal terminal EM and the signal from the first driving signal terminal are both high level signals. The voltage of the signal from the data signal terminal Data is the reference voltage Vref. In an embodiment, the voltage difference between the reference voltage Vref and the threshold voltage of the driving transistor DTFT is less than the voltage Vss of the second signal terminal VSS, that is, Vref−Vth<Vss.

Under the control of the signal from the first driving signal terminal Gate, the first transistor T1 is maintained to be turned on, and the voltage Va of the first node a is maintained as the reference voltage Vref. The driving transistor DTFT is also turned on due to the presetting of the previous stage. The second transistor T2 is turned off under the control of the signal from the second driving signal terminal RST. The third transistor T3 is turned on under the control of the signal from the control signal terminal EM. The third transistor T3 compensates for the voltage of the second node b. In an embodiment, the third transistor T3 couples the third node c to the second node b, and the current in the driving transistor DTFT flows from the third transistor T3 to the second node b, to increase the voltage of the second node b. Until the voltage of the second node b (i.e., the source of the driving transistor DTFT) is increased up to Vb=Vref-Vth, the driving transistor DTFT is turned off. In this way, since Vref-Vth<Vss, the light emitting diode OLED is still in a reverse bias state, and therefore does not emit light.

In the third stage S3 (writing stage), the signal from the first driving signal terminal Gate is a high level signal. The voltage of the signal from the data signal terminal Data is the data voltage Vdata, wherein the voltage value of the data voltage Vdata is less than the voltage value of the reference voltage Vref.

Under the control of the signal from the first driving signal terminal Gate, the first transistor T1 is turned on to provide the signal from the data signal terminal Data to the first node, such that the voltage Va of the first node a becomes the data voltage Vdata. Further, under the respective controls of the signals from the second driving signal terminal RST and the control signal terminal EM, the second transistor T2 and the third transistor T3 are turned off. Due to the bootstrap functions of the first capacitor C1 and the parasitic capacitor C2 of the light emitting diode OLED, the voltage of the first node a decreases, and the voltage of the second node b also decreases. The voltage of the second node b becomes Vb=Vref-Vth+(Vdata-Vref)×R, where R=C1/(C1+C2), C1 is the capacitance value of the first capacitor C1, and C2 is the capacitance value of the parasitic capacitor of the light emitting diode OLED.

In the fourth stage S4 (light emitting stage), the signal from the control signal terminal EM is a high level signal.

The first transistor T1 and the second transistor T2 are turned off under the respective controls of the signals from the first driving signal terminal Gate and the second driving signal terminal RST. The third transistor T3 is turned on under the control of the signal from the control signal terminal EM. The driving transistor DTFT is turned on. The voltage Vb of the second node b is coupled to the anode voltage VOLED of the light emitting element. Due to the bootstrap function of the first capacitor C1, the voltage of the first node a accordingly changes to Va=Vdata+(VOLED-(Vref-Vth+(Vdata-Vref)×R)). The driving transistor DTFT provides a driving current for driving the organic light emitting diode OLED to the third node c under the control of the voltage of the first node a.

In this stage, the gate of the driving transistor DTFT is coupled to the first node, and thus the gate voltage VG of the driving transistor DTFT is the voltage Va of the first node. A source of the driving transistor DTFT is coupled to the third node c, and is further coupled to the second node b due to the third transistor being turned on. Therefore, the source voltage VS of the driving transistor DTFT is the voltage Vb of the second node b, that is, VOLED. Therefore, the gate-source voltage VGS of the driving transistor DTFT is the voltage difference between its gate voltage VG and source voltage VS, which may be calculated as the voltage difference between the first node and the second node, VGS=Va-Vb.

The driving current IOLED provided by the driving transistor DTFT may be expressed as:

$$IOLED = K(VGS - Vth)^2$$
$$= K(Va - Vb - Vth)^2$$
$$= K(Vdata + (VOLED - (Vref - Vth + (Vdata - Vref) \times R)) - VOLED - Vth)^2$$
$$= K((1 - R) \times (Vdata - Vref))^2$$

Where K is a constant related to the process parameters and geometric dimensions of the driving transistor DTFT, and Vth is the threshold voltage of the driving transistor DFTF.

It can be seen from the above current formula that in the light emitting stage, the driving current provided by the driving transistor DTFT is not influenced by the threshold voltage of the driving transistor DTFT and the anode voltage of the organic light emitting diode OLED, and is only related to the signal from the data signal terminal. Therefore, according to an embodiment of the present disclosure, the influence of the threshold voltage of the driving transistor DTFT and the anode voltage of the light emitting element in the pixel circuitry on the driving current may be eliminated, such that the luminance of the display is uniform, and the display effect of the display is improved.

Figure 6:
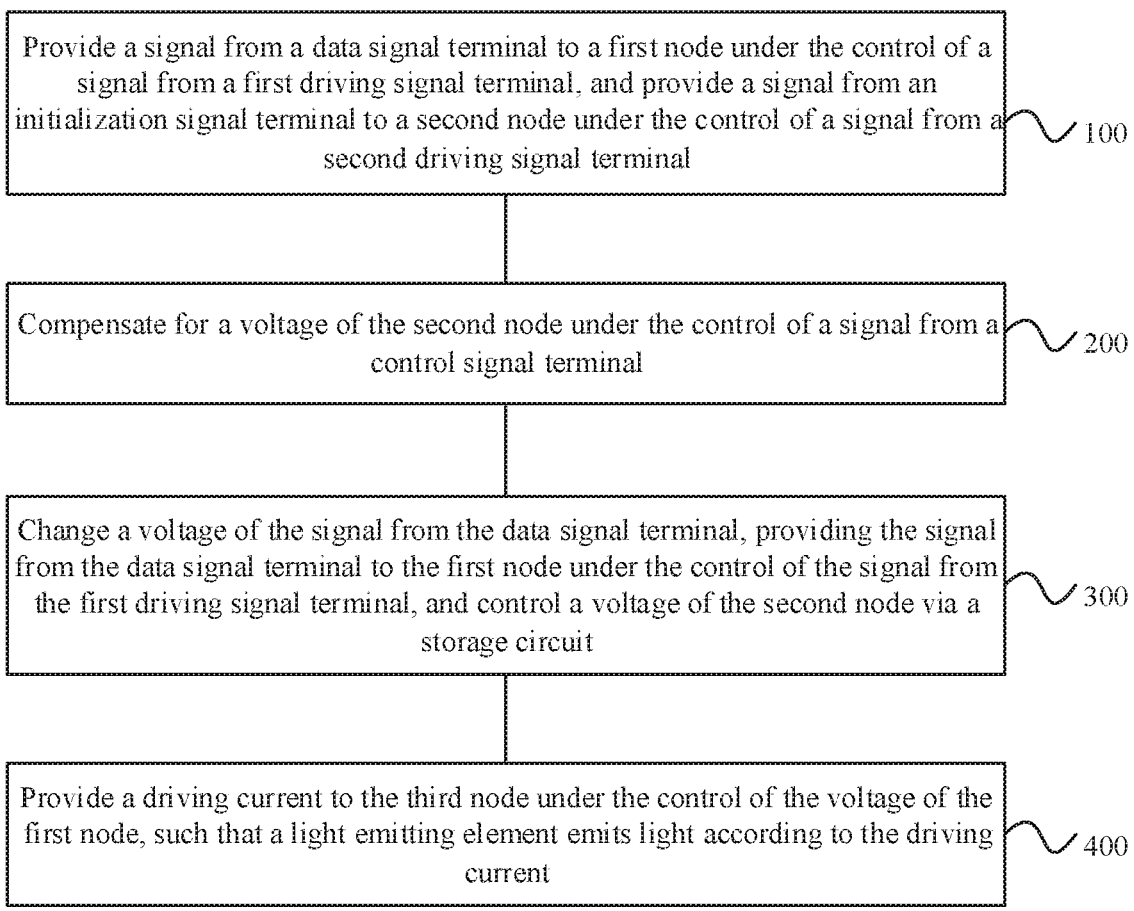
FIG. 6 illustrates a flow chart of a pixel driving method according to an embodiment of the present disclosure.

According to an embodiment of the present disclosure, a method for driving a pixel circuitry is also provided. FIG. 6 shows a schematic flow chart of a method for driving a pixel circuitry according to an embodiment of the present disclosure. For example, the pixel circuitry includes the pixel circuitry shown in FIG. 3 or FIG. 4, or the like.

In a first period of time 100, the signal from the data signal terminal is provided to the first node under the control of the signal from the first driving signal terminal. The signal from the initialization signal terminal is provided to the second node under the control of the signal from the second driving signal terminal.

In an embodiment, the signal from the control signal terminal EM, the signal from the first driving signal terminal Gate, and the signal from the second driving signal terminal RST are all high level signals. The voltage of the signal from the data signal terminal is the reference voltage Vref, such that the voltage of the first node a is Va=Vref. The voltage of the signal from the initialization signal terminal is the initialization voltage Vint, such that the voltage of the second node b is Vb=Vint, wherein the voltage value of the initialization voltage Vint is less than the reference voltage Vref, and the initialization voltage Vint is less than the voltage value of the voltage Vss of the second signal terminal VSS. The light emitting diode does not emit light.

In a second period of time 200, the signal from the data signal terminal is provided to the first node. The third node is coupled to the second node under the control of the signal from the control signal terminal. The current in the driving circuit flows to the second node from the third node, to increase the voltage of the second node. Therefore, the voltage of the second node is compensated for. In an embodiment where the driving circuit is a driving transistor, the voltage of the second node is increased to a voltage difference between the voltage of the first node (i.e., the gate voltage of the driving transistor) and the threshold voltage of the driving transistor.

In an embodiment, the signal from the control signal terminal EM and the signal from the first driving signal terminal Gate are both at high level signals. The signal from the second driving signal terminal RST is at a low level. The voltage of the signal from the data signal terminal Data is the reference voltage Vref. The voltage of the first node a is Va=Vref, and the voltage of the second node b is Vb=Vref-Vth. In the embodiment, the voltage difference between the reference voltage Vref and the threshold voltage Vth of the driving transistor DTFT is less than the voltage Vss of the second signal terminal VSS, that is, Vref–Vth<Vss. The light emitting diode does not emit light.

In a third period of time 300, the voltage of the signal from the data signal terminal changes. The signal from the data signal terminal is provided to the first node under the control of the signal from the first driving signal terminal. The voltage of the second node is controlled under the control of the storage circuit.

In an embodiment, the signal from the first driving signal terminal Gate is at a high level, and the signal from the control signal terminal EM and the signal from the second driving signal terminal RST are both low level signal. The voltage of the signal from the data signal terminal is changed from the reference voltage Vref to the data voltage Vdata, the data voltage Vdata being configured for controlling the light emission of the light emitting element, and the voltage value of the data voltage Vdata is less than the voltage value of the reference voltage Vref. The voltage of the first node is Va=Vdata. Due to the voltage change of the first node, the voltage of the second node is correspondingly changed to Vb=Vref–Vth+R×(Vdata–Vref), wherein the parameter R is related to the storage circuit and the parasitic capacitor of the light emitting element.

In a fourth period of time 400, the driving circuit provides a driving current to the third node under the control of the voltage of the first node. The third node is coupled to the second node under control of the signal from the control signal terminal such that the driving current flows to the light emitting element. The light emitting element emits light according to the driving current.

In the embodiment, the signal from the control signal terminal EM is at a high level, and the signal from the first driving signal terminal Gate and the signal from the second driving signal terminal RST are both low level signals. The voltage of the second node is equal to the voltage of the third node and is equal to the anode voltage of the light emitting element. The voltage of the second node b is Vb=VOLED. Under the action of the storage circuit, the voltage of the first node a is accordingly changed to Va=Vdata+(VOLED−(Vref−Vth+(Vdata−Vref)×R)).

The driving current IOLED of the driving transistor may be expressed as:

$$IOLED = K(VGS - Vth)^2$$
$$= K(Va - Vb - Vth)^2$$
$$= K(Vdata + (VOLED - (Vref - Vth + (Vdata - Vref) \times R)) - VOLED - Vth)^2$$
$$= K((1 - R) \times (Vdata - Vref))^2$$

Where K is a constant related to the process parameters and geometric dimensions of the driving transistor, VGS is the gate-to-source voltage difference of the driving transistor, and Vth is the threshold voltage of the driving transistor.

It may be seen from the above current formula that in the light emitting stage, the driving current provided by the driving transistor is not influenced by the threshold voltage of the driving transistor and the anode voltage of the light emitting element, and is only related to the signal from the data signal terminal (the data voltage and the reference voltage). Therefore, the influence of the threshold voltage of the driving transistor and the anode voltage of the light emitting element on the driving current can be eliminated, thereby ensuring uniform display luminance of the display and improving the display effect of the display.

According to an embodiment of the present disclosure, an array substrate including a plurality of the above pixel circuitries is also provided. In an embodiment, a plurality of pixel circuitries may be arranged in an array.

The array substrate provided by the embodiment of the disclosure may adopt low temperature poly-silicon (LTPS), and such design of a plurality of transistors and a plurality of capacitors does not affect the aperture ratio of display modules. In addition, the array substrate provided by the embodiment of the present disclosure may also adopt a process of amorphous silicon. It can be noted that the pixel driving circuit provided by the embodiment of the present disclosure may adopt a thin film transistor made of a process of amorphous silicon, polysilicon, oxide, or the like.

The type of the thin film transistor employed by the pixel circuitry provided by the embodiment of the present disclosure may be replaced according to actual needs. Moreover, although the above embodiment has been described by taking an active matrix organic light emitting diode as an example, the present disclosure is not limited to an array substrate using an active matrix organic light emitting diode, and may also be applied to an array substrate using other various light emitting diodes.

In another aspect, embodiments of the present disclosure also provide a display device including the above array substrate. The display device may be, for example, a display screen, a mobile phone, a tablet computer, a television, a display, a notebook computer, a digital photo frame, a navigator, a wearable device, or any product or component having a display function.

Several embodiments of the disclosure have been described in detail above, but the scope of protection of the disclosure is not limited thereto. It will be apparent to those of ordinary skill in the art that various modifications, substitutions, and variations may be made to the embodiments of the present disclosure without departing from the spirit and scope of the disclosure. The scope of the disclosure is defined by the appended claims.

What is claimed is:

1. A pixel circuitry comprising:
   a preset circuit coupled to a first driving signal terminal, a data signal terminal, a first node, a second driving signal terminal, an initialization signal terminal, and a second node, respectively, and configured to provide a signal from the data signal terminal to the first node under the control of a signal from the first driving signal terminal, and to provide a signal from the initialization signal terminal to the second node under the control of a signal from the second driving signal terminal;
   a storage circuit coupled between the first node and the second node and configured to store a voltage difference between the first node and the second node;
   a driving circuit coupled to the first node, a third node, and a first voltage signal terminal, respectively, and configured to provide a driving current to the third node under the control of a voltage of the first node;
   a compensation circuit coupled to the second node, the third node, and a control signal terminal, respectively, and configured to compensate for a voltage of the second node under the control of a signal from the control signal terminal; and
a light emitting element coupled between the second node and the second voltage signal terminal and configured to emit light according to the driving current.

2. The pixel circuitry according to claim 1, wherein the preset circuit comprises a first transistor and a second transistor,
wherein a control electrode of the first transistor is coupled to the first driving signal terminal, wherein a first electrode of the first transistor is coupled to the data signal terminal, and wherein a second electrode of the first transistor is coupled to the first node; and
wherein a control electrode of the second transistor is coupled to the second driving signal terminal, wherein a first electrode of the second transistor is coupled to the initialization signal terminal, and wherein a second electrode of the second transistor is coupled to the second node.

3. The pixel circuitry according to claim 1, wherein the storage circuit comprises a first capacitor, wherein one end of the first capacitor is coupled to the first node, and wherein the other end of the first capacitor is coupled to the second node.

4. The pixel circuitry according to claim 1, wherein the driving circuit comprises a driving transistor, wherein a control electrode of the driving transistor is coupled to the first node, wherein a first electrode of the driving transistor is coupled to the third node, and wherein a second electrode of the driving transistor is coupled to the first voltage signal terminal.

5. The pixel circuitry according to claim 4, wherein the compensation circuit is further configured to control, under the control of a signal from the control signal terminal, a current in the driving transistor to flow from the third node to the second node to increase the voltage of the second node until the voltage of the second node is increased up to a voltage difference between a voltage of the first node and a threshold voltage of the driving transistor.

6. The pixel circuitry according to claim 5, wherein the compensation circuit comprises a third transistor, wherein a control electrode of the third transistor is coupled to the control signal terminal, wherein a first electrode of the third transistor is coupled to the second node, and wherein a second electrode of the third transistor is coupled to the third node.

7. The pixel circuitry according to claim 1, wherein the compensation circuit comprises a third transistor, wherein a control electrode of the third transistor is coupled to the control signal terminal, wherein a first electrode of the third transistor is coupled to the second node, and wherein a second electrode of the third transistor is coupled to the third node.

8. The pixel circuitry according to claim 1, wherein the light emitting element is one of a light emitting diode, an organic light emitting diode, and an active matrix organic light emitting diode.

9. A method for driving a pixel circuitry according to claim 1, the method comprising:
in a first period of time, providing a signal from a data signal terminal to a first node under the control of a signal from a first driving signal terminal, and providing a signal from an initialization signal terminal to a second node under the control of a signal from a second driving signal terminal;
in a second period of time, compensating for a voltage of the second node under the control of a signal from a control signal terminal;
in a third period of time, changing a voltage of the signal from the data signal terminal, providing the signal from the data signal terminal to the first node under the control of the signal from the first driving signal terminal, and controlling a voltage of the second node via a storage circuit; and
in a fourth period of time, providing a driving current to the third node under the control of the voltage of the first node, such that a light emitting element emits light according to the driving current.

10. The method according to claim 9, wherein in the first period of time, the signal from the first driving signal terminal is at a high level, wherein the voltage of the signal from the data signal terminal is a reference voltage, wherein the signal from the second driving signal terminal is at a high level, wherein the signal from the initialization signal terminal is an initialization voltage, and wherein a voltage value of the initialization voltage is less than a voltage value of a voltage from a second voltage signal terminal.

11. The method according to claim 10, wherein in the second period of time, the signal from the first driving signal terminal is at a high level, wherein the voltage of the signal from the data signal terminal is the reference voltage, wherein the signal from the control signal terminal is at a high level wherein the current of a driving transistor in the driving circuit flows from the third node to the second node to increase the voltage of the second node to a voltage difference between the voltage of the first node and a threshold voltage of the driving transistor, and wherein the voltage difference is less than the voltage from the second voltage signal terminal.

12. The method according to claim 11, wherein in the third period of time, the signal from the first driving signal terminal is at a high level, wherein the voltage of the signal from the data signal terminal is a data voltage, and wherein the voltage value of the data voltage is less than the voltage value of the reference voltage.

13. The method according to claim 12, wherein in the fourth period of time, the signal from the control signal terminal is at a high level, and wherein the driving current is in correlation with the data voltage and the reference voltage.

14. An array substrate comprising the pixel circuitry of claim 1.

15. A display device comprising the array substrate of claim 14.

16. The array substrate according to claim 14, wherein a compensation circuit of the pixel circuitry comprises a third transistor, wherein a control electrode of the third transistor is coupled to a control signal terminal, wherein a first electrode of the third transistor is coupled to a second node, and wherein a second electrode of the third transistor is coupled to a third node.

17. A pixel circuitry comprising:
a first transistor, wherein a control electrode of the first transistor is coupled to a first driving signal terminal, wherein a first electrode of the first transistor is coupled to a data signal terminal, and wherein a second electrode of the first transistor is coupled to a first node;
a second transistor, wherein a control electrode of the second transistor is coupled to a second driving signal terminal, wherein a first electrode of the second transistor is coupled to an initialization signal terminal, and wherein a second electrode of the second transistor is coupled to a second node;

a first capacitor, wherein one end of the first capacitor is coupled to the first node, and wherein the other end of the first capacitor is coupled to the second node;

a driving transistor, wherein a control electrode of the driving transistor is coupled to the first node, wherein a first electrode of the driving transistor is coupled to a third node, and wherein a second electrode of the driving transistor is coupled to a first voltage signal terminal;

a third transistor, wherein a control electrode of the third transistor is coupled to a control signal terminal, wherein a first electrode of the third transistor is coupled to the second node, and wherein a second electrode of the third transistor is coupled to the third node; and a light emitting element coupled between the second node and a second voltage signal terminal.

18. The pixel circuitry according to claim 17, wherein the first transistor, the second transistor, the third transistor, and the driving transistor are N-type transistors.

19. An array substrate comprising the pixel circuitry according to claim 17.

20. A display device comprising the array substrate according to claim 19.

* * * * *

UNITED STATES PATENT AND TRADEMARK OFFICE
CERTIFICATE OF CORRECTION

PATENT NO. : 10,964,261 B2
APPLICATION NO. : 16/337227
DATED : March 30, 2021
INVENTOR(S) : Cheng Chung Yang Page 1 of 1

It is certified that error appears in the above-identified patent and that said Letters Patent is hereby corrected as shown below:

In the Claims

In Claim 11, Column 14, Line 29, delete "level wherein the current" and insert therefor -- level, wherein the current --.

Signed and Sealed this
Eighteenth Day of May, 2021

Drew Hirshfeld
*Performing the Functions and Duties of the
Under Secretary of Commerce for Intellectual Property and
Director of the United States Patent and Trademark Office*